United States Patent [19]

Segawa et al.

[11] Patent Number: 4,725,746

[45] Date of Patent: Feb. 16, 1988

[54] MOSFET BUFFER CIRCUIT WITH AN IMPROVED BOOTSTRAPPING CIRCUIT

[75] Inventors: Makoto Segawa; Shoji Ariizumi, both of Tokyo, Japan

[73] Assignee: Kabushiki Kaisha Toshiba, Kawasaki, Japan

[21] Appl. No.: 421,885

[22] Filed: Sep. 23, 1982

[30] Foreign Application Priority Data

Oct. 20, 1981 [JP] Japan .................. 56-167554
Oct. 20, 1981 [JP] Japan .................. 56-167555
Oct. 20, 1981 [JP] Japan .................. 56-167557

[51] Int. Cl.$^4$ .................. H03K 4/24; H03K 17/06; H03K 17/687; H03K 19.094
[52] U.S. Cl. .................. 307/482; 307/578; 307/450
[58] Field of Search .................. 307/450, 453, 475, 482, 307/481, 594, 597, 269, 270, 264

[56] References Cited

U.S. PATENT DOCUMENTS

| 3,395,291 | 7/1968 | Bogert | 307/453 |
| 4,096,584 | 6/1978 | Owen, III et al. | 365/227 |
| 4,122,361 | 10/1978 | Clemen et al. | 307/482 X |
| 4,129,794 | 12/1978 | Dickson et al. | 307/482 X |
| 4,390,797 | 6/1983 | Ishimoto | 307/482 X |
| 4,449,066 | 5/1984 | Aoyama et al. | 307/482 |

FOREIGN PATENT DOCUMENTS 2340770 2/1975 Fed. Rep. of Germany ...... 307/482
68032 8/1981 Japan .................. 307/482

Primary Examiner—Stanley D. Miller
Assistant Examiner—David R. Bertelson
Attorney, Agent, or Firm—Finnegan, Henderson, Farabow, Garrett & Dunner

[57] ABSTRACT

A semiconductor circuit has first and second MOS transistors which are connected between an output terminal and a positive and a reference power source terminal, respectively, a bootstrap capacitor connected between the output terminal and the gate of the first MOS transistor, an inverter which inverts the input signal and which supplies the inverted signal to the gate of the second MOS transistor after a predetermined delay timne, and a switching MOS transistor having a current path connected between the input terminal and the gate of the first MOS transistor. The switching MOS transistor has a threshold voltage greater than that of the second MOS transistor.

11 Claims, 10 Drawing Figures

MOSFET BUFFER CIRCUIT WITH AN IMPROVED BOOTSTRAPPING CIRCUIT

BACKGROUND OF THE INVENTION

The present invention relates to a semiconductor circuit with a bootstrap circuit.

Various studies on semiconductor circuits have been made recently in order to achieve higher integration density and high speed operation. Improvements in the read/write speed of a static MOS memory are particularly notable; the access time is almost comparable to that of a bipolar memory. Such improvements in the operation speed of the static MOS memory are mostly attributed to improvements in techniques of reducing the size of the MOS transistors and in circuit design of MOS transistors. For example, a semiconductor circuit which may be operated with less power consumption and at a high speed is being developed by using a bootstrap circuit, which is widely used in a dynamic semiconductor circuit, in a static semiconductor circuit.

A conventional driver circuit for driving a node having a large stray capacitance is known which uses a push-pull type inverter as shown in FIG. 1. This driver circuit has an E/D-type inverter 2 which includes a depletion-type (D-type) MOS transistor TR2 and an enhancement-type (E-type) MOS transistor TR4 and which inverts an input signal VI, and a push-pull circuit 4 which includes D-type and E-type MOS transistors TR6 and TR8 whose current paths are series-connected between power source terminals VD and VS. The input signal VI is supplied to the gate of the MOS transistors TR4 and TR6, the output signal from the inverter 2 is supplied to the gate of the E-type MOS transistor TR8, and a stray capacitor associated between the power source terminals VD and VS is charged and discharged in accordance with the output signal from the push-pull circuit 4.

The driver circuit as described above is advantageous as compared to an E/D-type inverter driver circuit in that a DC current may be made small and in that a relatively large stray capacitor can be charged with a small power consumption since a large charging current is permitted to flow only in the transient state. However, since the output stage of such a driver circuit is formed of an E/D-type push-pull circuit, a DC current will flow through this push-pull circuit.

In order to prevent the flow of such a DC current, a static bootstrap buffer circuit has been proposed which uses an E/E-type output circuit, as shown in FIG. 2, and which is capable of raising the output signal of high level to the VD level. The buffer circuit has an inverter 2 which is formed of a D-type MOS transistor TR2 and an E-type MOS transistor TR4 and which inverts the input signal VI, an output circuit 6 formed of E-type MOS transistors TR12 and TR14 whose current paths are series-connected between power source terminals VD and VS, and an E-type MOS transistor TR16 whose current path is connected between the input terminal VI and the gate of the MOS transistor TR12. The output signal from the inverter 2 is supplied to the gate of the MOS transistor TR14, and a capacitor C2 is connected between the gate of the MOS transistor TR12 and a node 8 between the MOS transistors TR12 and TR14.

When the input signal VI rises to a logic level "1" in this buffer circuit, the capacitor C2 begins to be charged. The capacitor C2 continues to be charged until the input voltage VI reaches the threshold voltage of the MOS transistor TR4 to turn on the MOS transistor TR4, and the output signal from the inverter 2 is lower than the threshold voltage of the MOS transistor TR14 to turn off the MOS transistor TR14. When the MOS transistor TR14 is turned off, the potential at the node 8 at one end of the capacitor C2 rises to a logic level "1", and the potential at the other end of the capacitor C2 rises quickly due to the bootstrap action. As a result, a voltage higher than the power source voltage VD is applied to the gate of the MOS transistor TR12 and the power source voltage VD is supplied to the node 8 through the MOS transistor TR12. Thus, the potential at the node 8 rises to the power source voltage VD. On the other hand, when the input signal VI falls to a logic level "0", a signal of logic level "1" is generated by the inverter 2 to turn on the MOS transistor TR14 and to discharge the capacitor C2. In this case, the MOS transistor TR12 is turned off, and no DC current flows in the output circuit 6. Accordingly, the power consumption of the buffer circuit is suppressed to the minimum.

The push-pull circuit of bootstrap-type as described above is excellent in terms of low power consumption. However, in order to operate this push-pull circuit at a high speed, the switching speed of the inverter acting as a delay circuit must be increased. When the switching speed of the inverter 2 is increased, the bootstrap action may be initiated before the capacitor C2 is sufficiently charged. If the MOS transistor TR14 is turned off in response to the output signal from the inverter 2 before the potential level of the input signal VI reaches a level of (VC - VTH) (VTH is the threshold voltage of the MOS transistor TR16), the charge on the capacitor C2 is discharged through the MOS transistor TR16 since the MOS transistor TR16 is kept on. Then, effective bootstrap action may not be obtained, and therefore, the output signal VO will rise gently. Accordingly, even if the switching speed of the inverter 2 is increased and the timing of the leading edge of an output signal VO is made earlier, the output signal VO will take a long rise time to reach a predetermined high potential level. This lowers the switching speed of the push-pull circuit.

SUMMARY OF THE INVENTION

It is an object of the present invention to provide a semiconductor circuit which has a bootstrap circuit capable of operating at a high speed and in a stable manner.

According to an aspect of the present invention, there is provided a semiconductor circuit comprising a load MOS transistor and a driver MOS transistor which are series-connected between first and second terminals; bootstrap capacitive means connected between the gate of the load MOS transistor and a node between the load drive MOS transistor and the driver MOS transistor; inverting means for inverting an input signal supplied to a signal input terminal and for supplying an inverted signal to the gate of the driver MOS transistor after a predetermined delay time; and a switching MOS transistor which has a current path connected between the signal input terminal and the gate of the load MOS transistor and which has a threshold voltage greater than that of the driver MOS transistor.

According to another aspect of the present invention, there is also provided a semiconductor circuit comprising a load MOS transistor and a driver MOS transistor which are series-connected between first and second terminals; bootstrap capacitive means connected between the gate of the load MOS transistor and a node between the load drive MOS transistor and the driver MOS transistor; inverting means for inverting an input signal supplied to a signal input terminal and for supplying an inverted signal to the gate of the driver MOS transistor after a predetermined delay time; a switching MOS transistor which has a current path connected between the signal input terminal and the gate of the load MOS transistor; and gate voltage applying means for applying a gate voltage lower than a voltage supplied to the first terminal to the gate of the switching MOS transistor.

DETAILED DESCRIPTION OF THE PREFERRED EMBODIMENTS

Figure 1:
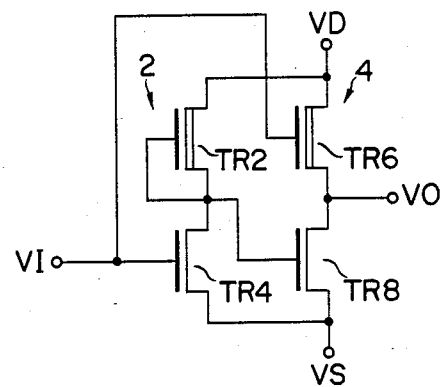
FIG. 1 is a circuit diagram of a conventional driver circuit for driving a node of large capacitance.
Figure 2:
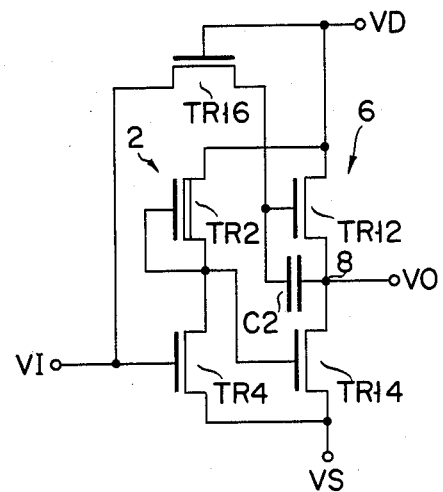
FIG. 2 is a circuit diagram of a conventional driver circuit having a bootstrap function.
Figure 3:
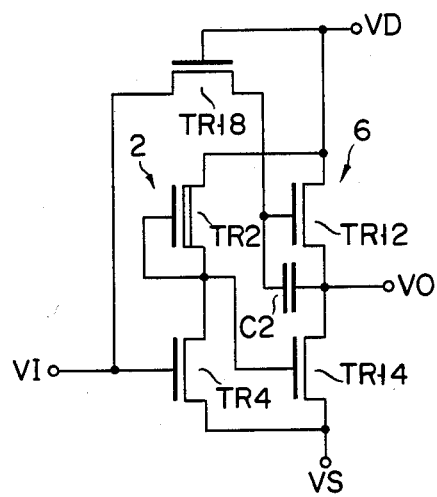
FIG. 3 is a circuit diagram of a driver circuit according to an embodiment of the present invention which properly performs a bootstrap operation.

FIG. 3 shows a semiconductor circuit according to an embodiment of the present invention. This semiconductor circuit is basically the same as that shown in FIG. 2 except that an n-channel MOS transistor TR18 is used in place of the MOS transistor TR16. The n-channel MOS transistor TR18 has a threshold voltage VTH1 higher than that of E-type MOS transistors TR4, TR12 and TR14.

Figure 4:
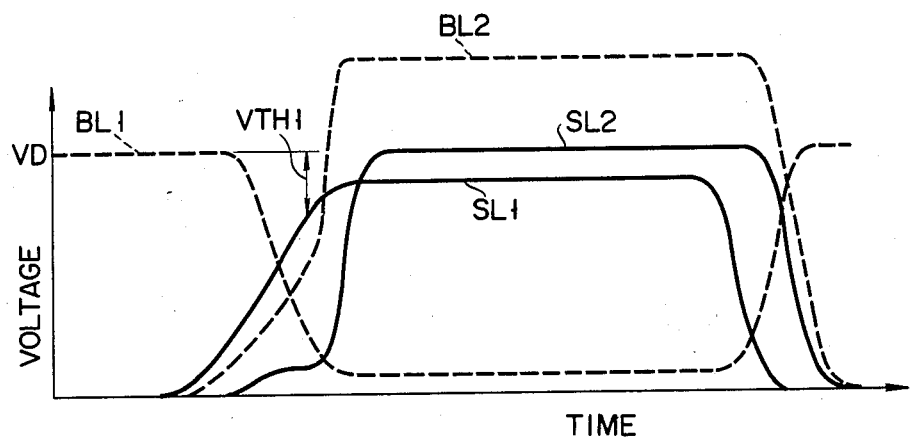
FIG. 4 shows the signal waveform for explaining the mode of operation of the driver circuit shown in FIG. 3.

A case will be considered where an input signal VI as indicated by a solid line SL1 in FIG. 4 is applied. When the input signal VI reaches a predetermined level, the E-type MOS transistor TR4 begins to be rendered conductive. At the same time, the output signal from an inverter 2 formed of a D-type MOS transistor TR2 and an E-type MOS transistor TR4 begins to fall from a power source voltage VD as indicated by a broken line BL1. At this time, with an increase in the input signal VI, a capacitor C2 is charged through the MOS transistor TR18 as indicated by a broken line BL2. Then, a predetermined charging time determined by the conduction resistance of the MOS transistor TR18 and the capacitance of the capacitor C2 elapses, and the capacitor C2 is discharged to a predetermined potential level. When the input signal VI reaches the predetermined potential level (VD−VTH1), the MOS transistor TR18 is turned off. Thereafter, when the output signal from the inverter 2 becomes sufficiently small to turn off a MOS transistor TR14 which forms an inverter 6 in cooperation with an E-type MOS transistor TR12, an output voltage VO quickly rises as indicated by a solid line SL2. In this case, the gate voltage of the MOS transistor TR12 quickly rises to a potential level significantly higher than the power source voltage VD due to the bootstrap action, as indicated by the broken line BL2. Then, the MOS transistor TR12 is set in the completely conductive state, and an output voltage of the VD level is obtained.

In the embodiment shown in FIG. 3, it is important that the threshold voltage of the MOS transistor TR18 is set to be greater than that of the MOS transistor TR14 so that the MOS transistor TR18 is turned off after the capacitor C2 is charged to a sufficient potential level by the potential rise of the input signal VI and before the MOS transistor TR14 is turned off. The threshold voltage of the MOS transistor TR18 is set to be equal to or smaller than the difference between the power source voltage VD and the voltage level of the input signal VI at a time when the capacitor C2 is charged to the predetermined potential level, and is set to be greater than the difference between the power source voltage VD and the voltage level of the input signal VI at a time when the output voltage from the inverter 2 becomes smaller than the threshold voltage of the MOS transistor TR14. In this manner, after the MOS transistor TR18 is turned off, the MOS transistor TR14 is turned off and the bootstrap operation is properly performed.

When forming the MOS transistor TR18, an impurity such as boron is ion-implanted into the channel region in the same manner as the case of the MOS transistors TR4, TR12 and TR14, and then further boron ion-implantation is performed only to the channel region of the MOS transistor TR18, so that the MOS transistor TR18 may have a channel region of higher impurity concentration. Alternatively, boron may be ion-implanted at a higher impurity concentration into the channel region of the MOS transistor TR18 in a separate step from that of doping impurities into the channel regions of the MOS transistors TR4, TR12 and TR14.

Referring to FIG. 4, the high level of the input signal VI is indicated lower than the power source voltage VD. This corresponds to the case wherein the load MOS transistor at the output stage of a semiconductor circuit connected to the input stage of the semiconductor circuit shown in FIG. 3 is of E-type. Thus, even if the high level of the input signal VI is lower than the power source voltage VD, a sufficiently effective bootstrap action may be obtained with the semiconductor circuit shown in FIG. 3.

When the input voltage VI goes from high to low level, the MOS transistor TR18 is turned on, and the capacitor C2 is discharged through this MOS transistor TR18.

Figure 5:
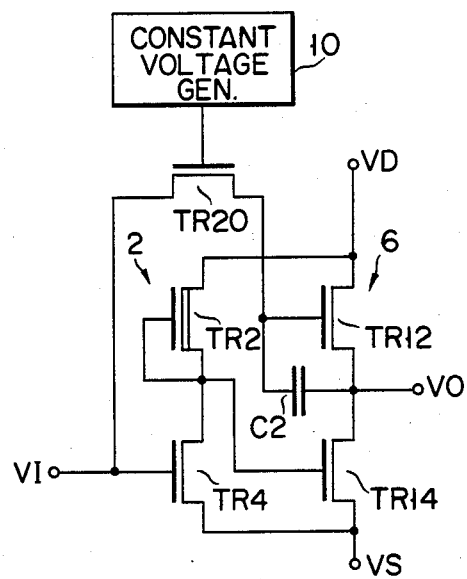
FIG. 5 is a circuit diagram of a driver circuit according to another embodiment of the present invention.

FIG. 5 shows a circuit diagram of a semiconductor circuit according to another embodiment of the present invention. This semiconductor circuit is basically the same as that shown in FIG. 3 except that an n-channel MOS transistor TR20 having the same threshold voltage as that of E-type MOS transistors TR4, TR12 and TR14 is used in place of the MOS transistor TR18, and a constant voltage generating circuit 10 is connected to the gate of the MOS transistor TR20. In this semiconductor circuit, since a constant voltage VC lower than a power source voltage VD is applied from the constant voltage generating circuit 10 to the gate of the MOS transistor TR20, the MOS transistor TR20 is turned off in response to the leading edge of an input signal VI at a timing faster than in a case of the circuit shown in FIG. 2. The constant voltage VC is set at such a value that the MOS transistor TR20 may be turned off after a capacitor C2 is charged to a sufficient potential level by an increase in the potential level of the input signal VI and before the MOS transistor TR14 is turned off. In other words, the constant voltage VC is set to be equal to or greater than the sum of the threshold voltage of the MOS transistor TR20 and the voltage level of the input signal VI at a time when the capacitor C2 is charged to a predetermined potential level, and is smaller than the sum of the threshold level of the MOS transistor TR20 and the voltage level of the input signal VI at a time when the output voltage from the inverter 2 becomes smaller than the threshold voltage of the MOS transistor TR14. With this arrangement, similar effects as those obtainable with the semiconductor circuit shown in FIG. 3 are obtained.

Figure 6:
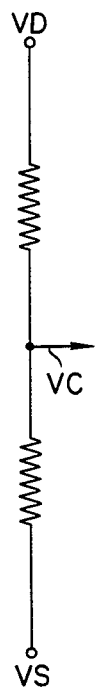
FIGS. 6, 7 and 8 show examples of a constant voltage generating circuit used in the driver circuit shown in FIG. 5.
Figure 7:
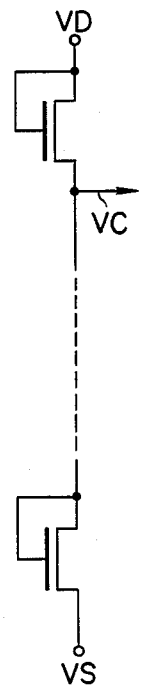
Figure 8:

FIGS. 6, 7 and 8 show examples of the constant voltage generating circuit 10 shown in FIG. 5. Referring to FIG. 6, the constant voltage generating circuit 10 includes two resistors 101 and 102 which are series-connected between the power source terminals VD and VS. The output voltage is obtained from the node between the resistors 101 and 102. Referring to FIG. 7, the constant voltage generating circuit 10 includes a plurality of E-type MOS transistors whose current paths are series-connected between the power source terminals VD and VS. The gate and drain of each MOS transistor are connected to each other. The output voltage is obtained from the node between the E-type MOS transistors. Referring to FIG. 8, the constant voltage generating circuit includes a plurality of D-type MOS transistors whose current paths are series-connected between the power source terminals VD and VS. The gate and source of each MOS transistor are connected to each other. The output voltage is obtained from the node of the D-type MOS transistors.

Figure 9:
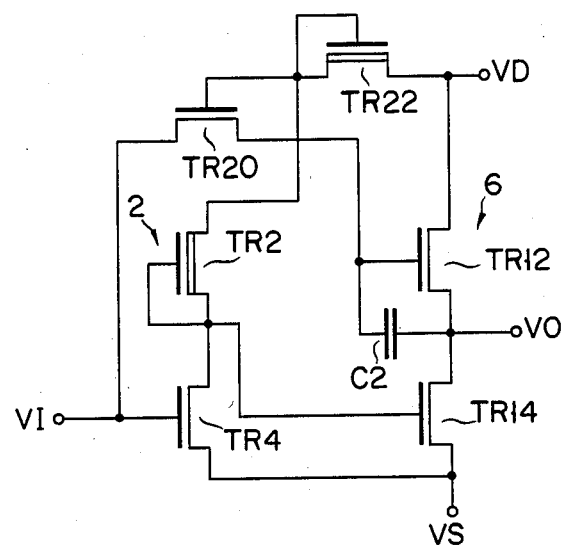
FIG. 9 is a circuit diagram of a driver circuit according to still another embodiment of the present invention.

FIG. 9 shows a circuit diagram of a semiconductor circuit according to still another embodiment of the present invention. This semiconductor circuit is basically the same as that shown in FIG. 5 except that the drain of a MOS transistor TR2 and the gate of a MOS transistor TR20 are connected to a power source terminal VD through the current path of a D-type n-channel MOS transistor TR22 which serves as a resistor element.

Figure 10:
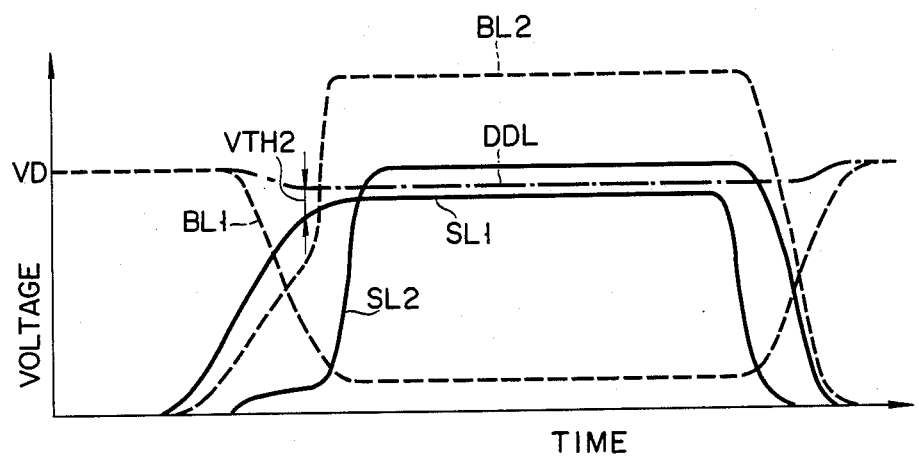
FIG. 10 shows the signal waveform for explaining the mode of operation of the driver circuit shown in FIG. 9.

As in the case shown in FIG. 4, when an input signal VI indicated by a solid line SL1 shown in FIG. 10 is applied, an output voltage VO, the output voltage from an inverter 2, and the gate voltage from an E-type MOS transistor TR12 change as indicated by a solid line SL2 and broken lines BL1 and BL2, respectively. When the input signal VI is at a logic level "0", a power source voltage VD is applied to the gates of the MOS transistors TR14 and TR20. Thereafter, when the input signal VI becomes greater than the threshold voltage of the MOS transistor TR4, the gate voltage of the MOS transistor TR14 decreases as indicated by the broken line BL1 in accordance with the ratio of the sum of the resistances of the MOS transistors TR2 and TR22 to the conduction resistance of the MOS transistor TR14 which decreases with an increase in the input signal VI. Simultaneously, the gate voltage of the MOS transistor TR20 decreases as indicated by a dash-and-dot line DDL in accordance with the ratio of the resistance of the MOS transistor TR22 to the sum of the resistances of the MOS transistors TR2 and TR4. The resistance of the MOS transistor TR22 is set so that, in the conductive state of the MOS transistor TR4, the timing at which the input voltage VI becomes greater than the difference between the gate voltage of the MOS transistor TR20 and a threshold voltage VTH2 of the MOS transistor TR20 is after a capacitor C2 is charged to a sufficiently high potential level and before the output voltage from an inverter 2 becomes smaller than the threshold voltage of the MOS transistor TR14. With this arrangement, a proper bootstrap action may be performed as in the former embodiments.

When the input voltage VI goes from high to low level, the MOS transistor TR4 is turned off, and the power source voltage VD is applied to the gate of the MOS transistor TR20. The MOS transistor TR20 is completely turned on, and the capacitor C2 is quickly discharged through the MOS transistor 20.

Although the present invention has been described with reference to its particular embodiments, the present invention is not limited to this. For example, it is possible to set the threshold voltage of the switching MOS transistor TR20 to be greater than that of the MOS transistor TR14 in the embodiments shown in FIGS. 5 and 9.

What we claim is:

1. A semiconductor circuit comprising:
   first and second terminals and input and output terminals;
   a load MOS transistor and a driver MOS transistor which are connected between said output terminal and said first and second terminals, respectively;
   bootstrap capacitive means connected between said output terminal and a gate of said load MOS transistor;
   inverting means for inverting an input signal supplied to said input terminal and supplying an inverted signal to a gate of said driver MOS transistor after a predetermined delay time; and
   a switching MOS transistor having a current path connected between said input terminal and the gate of said load MOS transistor and having a threshold voltage greater than a threshold voltage of said driver MOS transistor.

2. A semiconductor circuit according to claim 1, wherein said inverting means comprises a depletion-type MOS transistor having a source-drain current path connected in series between the first and second terminals with a source-drain current path of an enhancement-type MOS transistor, the gate of said depletion-type MOS transistor being connected to the drain of said depletion-type MOS transistor, and the gate of said enhancement-type MOS transistor being connected to said input terminal.

3. A semiconductor circuit according to claim 1 or 2, wherein a gate of said switching MOS transistor is directly connected to said first terminal.

4. A semiconductor circuit comprising:
   first and second terminals and input and output terminals;
   a load MOS transistor and a driver MOS transistor which are connected between said output terminal and said first and second terminals, respectively;
   bootstrap capacitive means connected between said output terminal and a gate of said load MOS transistor;
   inverting means for inverting an input signal supplied to said input terminal and supplying an inverted signal to a gate of said driver MOS transistor after a predetermined delay time;

a switching MOS transistor which has a current path connected between said input terminal and the gate of said load MOS transistor; and constant gate voltage applying means for applying a gate voltage lower than a voltage applied to said first terminal to a gate of said switching MOS transistor.

5. A semiconductor circuit according to claim 4, wherein said inverting means comprises a depletion-type MOS transistor having a source-drain current path connected in series between the first and second terminals with the source-drain of an enhancement-type MOS transistor, the gate of said depletion-type MOS transistor being connected to the drain of said depletion-type MOS transistor, and the gate of said enhancement-type MOS transistor being connected to said input terminal.

6. A semiconductor circuit according to claim 4 or 5, wherein said gate voltage applying means comprises first and second resistive means which are connected between the gate of said switching MOS transistor and said first and second terminals, respectively.

7. A semiconductor circuit according to claim 6, wherein each of said first and second resistive means comprises at least one resistor.

8. A semiconductor circuit according to claim 6, wherein each of said first and second resistive means comprises at least one enhancement-type MOS transistor.

9. A semiconductor circuit according to claim 6, wherein each of said first and second resistive means comprises at least one depletion-type MOS transistor.

10. A semiconductor circuit comprising:

first and second and input and output terminals;

a load MOS transistor and a drive MOS which are connected between said output terminal and said first and second terminals, respectively;

bootstrap capacitive means connected between said output terminal and a gate of said load MOS transistor;

inverting means for inverting an input signal supplied to said input terminal and supplying an inverted signal to a gate of said drive MOS transistor after a predetermined delay time, said inverting means including a depletion-type MOS transistor having a source-drain current path connected in series between the first and second terminals with a source-drain current path of an enhancement-type MOS transistor;

a switching MOS transistor which has a current path connected between said input terminal and the gate of said load MOS transistor; and constant gate voltage applying means for applying a gate voltage lower than a voltage applied to said first terminal to a gate of said switching MOS transistor.

11. A semiconductor circuit according to claim 10, wherein said gate voltage applying means is formed of a depletion-type MOS transistor having a current path and a gate, one end of said current path being connected to said first terminal, and the other end of said current path and said gate being connected to the gate of said switching MOS transistor and to the other end of the current path of said depletion-type MOS transistor of said inverting means.

* * * * *

UNITED STATES PATENT AND TRADEMARK OFFICE
CERTIFICATE OF CORRECTION

PATENT NO. : 4,725,746
DATED : February 16, 1988
INVENTOR(S) : Segawa et al.

It is certified that error appears in the above-identified patent and that said Letters Patent is hereby corrected as shown below:

Title Page, under "Assignee:" change "Kabushiki Kaisha Toshiba" to --Tokyo Shibaura Denki Kabushiki Kaisha--.

Signed and Sealed this

Eleventh Day of October, 1988

Attest:

DONALD J. QUIGG

*Attesting Officer*        *Commissioner of Patents and Trademarks*